US010091894B2

(12) United States Patent
Liskow

(10) Patent No.: US 10,091,894 B2
(45) Date of Patent: Oct. 2, 2018

(54) ELECTRONIC CONTROL MODULE, IN PARTICULAR FOR GEAR MECHANISM CONTROL, WITH ELECTRICAL COMPONENTS WHICH ARE WELDED TO PRESS CONTACTS

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/311,496

(22) PCT Filed: Mar. 18, 2015

(86) PCT No.: PCT/EP2015/055608
§ 371 (c)(1),
(2) Date: Nov. 15, 2016

(87) PCT Pub. No.: WO2015/176842
PCT Pub. Date: Nov. 26, 2015

(65) Prior Publication Data
US 2017/0086313 A1  Mar. 23, 2017

(30) Foreign Application Priority Data
May 19, 2014 (DE) .................. 10 2014 209 411

(51) Int. Cl.
*H05K 1/18* (2006.01)
*H05K 1/11* (2006.01)
*H05K 5/00* (2006.01)
*H05K 3/30* (2006.01)
*H05K 3/32* (2006.01)

(52) U.S. Cl.
CPC ........... *H05K 5/0082* (2013.01); *H05K 1/111* (2013.01); *H05K 1/181* (2013.01); *H05K 3/303* (2013.01);
(Continued)

(58) Field of Classification Search
CPC ...... H05K 5/0082; H05K 3/328; H05K 3/303; H05K 1/111; H05K 1/181; H05K 2201/10295; H05K 2203/107
See application file for complete search history.

(56) References Cited

U.S. PATENT DOCUMENTS 5,890,284 A  *  4/1999  Chartrand ............. H05K 1/114
174/263
7,344,388 B2    3/2008  Kreuter
(Continued)

FOREIGN PATENT DOCUMENTS

DE    10 2011 083 576 A1    3/2013
DE    10 2011 085 170 A1    4/2013
(Continued)

OTHER PUBLICATIONS

International Search Report corresponding to PCT Application No. PCT/EP2015/055608, dated Jun. 16, 2015 (German and English language document) (7 pages).

*Primary Examiner* — Hoa C Nguyen
(74) *Attorney, Agent, or Firm* — Maginot, Moore & Beck LLP

(57) ABSTRACT

An electronic control module for a gear mechanism controller in motor vehicles includes a printed circuit board and an electrical component. The printed circuit board has a mounting side and includes conductor tracks. The electrical component has an electrically conductive connection section. The control module further includes a press contact that is pressed into an opening in the printed circuit board such that it is mechanically fixed to the printed circuit board. The press contact forms an electrical contact with a conductor track of the printed circuit board via an electrically conductive mating connection section of the press contact. The connection section of the electrical component is connected to the mating connection section of the press contact by a
(Continued)

welded connection. The connection technique enables soldered connections to be dispensed with and replaced by cold pressing of press contacts and subsequent welding by, for example, a copper/copper laser welding process.

11 Claims, 3 Drawing Sheets

(52) U.S. Cl.
CPC ... *H05K 3/328* (2013.01); *H05K 2201/10295* (2013.01); *H05K 2203/107* (2013.01)

(56) References Cited

U.S. PATENT DOCUMENTS

| | | | |
|---|---|---|---|
| 7,828,561 B2* | 11/2010 | Gueckel | H01R 12/585 439/751 |
| 2005/0034890 A1 | 2/2005 | Ju | |
| 2005/0239343 A1 | 10/2005 | Kashiwazaki | |
| 2007/0123083 A1* | 5/2007 | Kreuter | H01R 4/184 439/260 |
| 2008/0144260 A1 | 6/2008 | Honda | |
| 2009/0176402 A1 | 7/2009 | Honda | |
| 2010/0294349 A1* | 11/2010 | Srinivasan | H01L 21/2255 136/255 |
| 2013/0205094 A1* | 8/2013 | Benhase | G06F 12/0891 711/135 |

FOREIGN PATENT DOCUMENTS

| | | |
|---|---|---|
| DE | 10 2011 086 896 A1 | 5/2013 |
| DE | 10 2011 089 474 A1 | 6/2013 |
| WO | 2009/068442 A1 | 6/2009 |

* cited by examiner

ELECTRONIC CONTROL MODULE, IN PARTICULAR FOR GEAR MECHANISM CONTROL, WITH ELECTRICAL COMPONENTS WHICH ARE WELDED TO PRESS CONTACTS

This application is a 35 U.S.C. § 371 National Stage Application of PCT/EP2015/055608, filed on Mar. 18, 2015, which claims the benefit of priority to Serial No. DE 10 2014 209 411.9, filed on May 19, 2014 in Germany, the disclosures of which are incorporated herein by reference in their entirety.

BACKGROUND

The present disclosure relates to an electronic control module, as it may be used in particular for transmission controls in motor vehicles, and a method for producing an electronic control module.

In motor vehicles, electronic control modules are used in particular for controlling transmissions. In this case, it may be advantageous to arrange a control module at the transmission, for example, inside a transmission housing, in such a way that it comes into contact with the transmission fluid, for example, an aggressive transmission oil.

The control modules may, for example, include electrical components such as plugs, sensors, actuators, at least one encapsulated control device (ICU, transmission control unit), and, if necessary, additional components. The electrical components may be arranged on a printed circuit board. The printed circuit board may be a conventional printed circuit board, on the surface of which or in the interior of which conducting paths are formed, with the aid of which the electrical components arranged on a placement side of the printed circuit board could be electrically interconnected. For this purpose, each of the electrical components may have electrically conductive terminal sections, for example, in the form of wires routed out of the component, by means of which the component may be brought into electrical contact with one of the conducting paths provided on the printed circuit board.

An arrangement of the control module in the transmission fluid may pose major challenges for the packaging of the building components on the printed circuit board of the electronic control module, since the electrical connections are, for example, subjected to high temperature change loading and furthermore must be able to withstand the aggressive transmission fluid and possibly metal shavings contained therein.

Conventionally, the electrical components have typically been soldered via their terminal sections to the conducting paths of the printed circuit board. US 2009/0176402 A1 and US 2008/0144260 A1 demonstrate, for example, plug parts whose terminal elements are soldered into vias of the printed circuit board.

However, it has been observed that solder connections cannot always ensure long-term reliability which is required, for example, in vehicle production; therefore, malfunctions or failures may occur in electronic control modules for transmission controls.

SUMMARY

Embodiments of the present disclosure enable an electronic control module which in particular is better able than conventional control modules to meet the high demands arising in the case of use as a transmission control, with respect to a long-term, stable electrical connection between electrical components and conducting paths of a printed circuit board. In particular, embodiments of control modules according to the present disclosure may be produced in a simple, reliable, and/or economical manner.

According to a first aspect of the present disclosure, an electronic control module, in particular for a transmission control, is provided, which includes a printed circuit board and at least one electrical component. The printed circuit board is provided with conducting paths and has a placement side. The electrical component has at least one electrically conductive terminal section. The control module is characterized in that it furthermore includes at least one press contact which is pressed into an opening in the printed circuit board in such a way that it is mechanically fixed to the printed circuit board and forms both a mechanical and an electrical contact with a conducting path of the printed circuit board, via a subarea of an electrically conductive mating terminal section of the press contact pressed into the printed circuit board. Furthermore, a weld connection between the terminal section of the electrical component and the mating terminal section of the press contact is provided.

According to a second aspect of the present disclosure, a method for producing an electronic control module, in particular a control module according to the above first aspect of the present disclosure, is described. In the method, a printed circuit board having a placement side and having conducting paths, and an electrical component having at least one electrically conductive terminal section, are provided. The method is characterized in that a press contact is pressed into an opening in the conducting path in such a way that it is mechanically fixed to the printed circuit board and forms both a mechanical and an electrical contact with a conducting path of the printed circuit board, via a subarea of an electrically conductive mating terminal section of the press contact pressed into the printed circuit board; and the terminal section of the electrical component is welded to the mating terminal section of the press contact.

Embodiments of the present disclosure may inter alia be considered to be based on the ideas and thoughts described below.

As initially stated, in the case of conventional electronic control modules, electrical components have generally been soldered to conducting paths of a printed circuit board. For this purpose, for example, terminal sections of an electrical component have been arranged in through-holes in the printed circuit board and then dipped from an opposite side into a solder bath, so that solder was able to electrically conductively connect the terminal sections to the conducting paths.

However, it has been observed that solder connections established in such a way may have a certain probability of failure, for example, in the range of 2 ppm; therefore, faults may occur during the operation of the electronic module. This problem has been exacerbated in the last several years, since, according to recent standards, it is generally no longer allowed to use solder containing lead. Therefore, solder connections must be elaborately developed and tested and adapted to particular thermomechanical characteristics of lead-free solder.

It is therefore provided to replace conventional solder connections in an electronic control module by a new type of electrical connection of electrical components to a printed circuit board, in which solder may be dispensed with. In the case of this connection, first, one or multiple press contacts are pressed into an opening in the printed circuit board.

Here, a press contact may be understood to mean a small component which is made entirely of electrically conductive material, for example, a metal, or is at least partially provided with an electrically conductive material, for example, on its surface. In this case, the press contact has at least one web, which is sized in such a way that it may be pressed into an opening provided in the printed circuit board under pressure. The structure or the dimensions of the web are designed in such a way that conductive material of the press contact is pressed to conductive material of a conducting path of the printed circuit board in the area of the opening, at least at a subarea of the electrically conductive mating terminal section of the press contact pressed into the printed circuit board, and an electrical connection is thus established. Furthermore, the web of the press contact is sized in such a way that the press contact is kept mechanically stable on the printed circuit board after pressing into the opening. Since pressing in the press contact generally requires no local heating of components to be connected, it is also referred to as cold contacting.

In addition to the web pressed into the opening, the press contact has an electrically conductive mating terminal section. This mating terminal section is electrically conductively connected to the electrically conductive material at the web of the press contact, so that, after pressing in, an electrical connection between the mating terminal section and the conducting path of the printed circuit board is provided overall.

After the press contact or the press contacts have been arranged on the printed circuit board, the electrical components may be arranged on the placement side of the printed circuit board, and their terminal sections may then be suitably welded to the mating terminal sections of the press contacts.

In the described production method or the correspondingly produced electronic control module, soldering of electrical components may be omitted and replaced by the pressing in of press contacts and subsequent welding of the connection and mating terminal sections. As a result, testing and development costs may be significantly reduced in comparison to conventional soldering. For example, solder joints must generally be tested four times longer than weld joints. In addition, it may be assumed that a failure statistic in the case of weld connections is significantly lower than in the case of solder connections. In particular, it is assumed that weld connections exhibit practically no faults during operation, whereas a failure statistic of 2 ppm may be observed in the case of solder connections. In addition, weld connections have a significantly higher mechanical load capacity and temperature resistance in comparison to solder connections.

As described in greater detail below, under the provided production method, thermally induced mechanical stress within the electronic control module may furthermore be significantly reduced, since, for example, the local, rapid welding of the connection and mating terminal sections results in considerably less heat input than with conventional soldering processes.

According to one embodiment, the terminal section of the electronic component and the mating terminal section of the press contact may be formed with copper, i.e., made of a material containing copper or made completely of copper. Not only does copper have excellent electrical conductivity, it also has a relatively low melting point, so that it can be welded even at low heat levels.

In particular, it may be advantageous to weld the terminal section of the electrical component to the mating terminal section of the press contact by means of a laser. Laser welding is well suited to industrial applications and may provide many advantages, for example, high positioning accuracy of the weld, non-contact and thus contamination-free welding, energy efficiency, etc.

In particular, for the laser welding of copper which is contained, for example, in the terminal section and the mating terminal section, green laser light may be used. For copper-copper welding, considerably smaller and more economical systems may be used than is known, for example, in NiFe—Cu laser welding, which is conventionally often used for other purposes. A laser which is applicable to Cu—Cu welding may, for example, have considerably lower laser power than is the case in conventional lasers used for welding.

For example, the laser may have a laser light output in the continuous operating mode of less than 500 W, preferably less than 200 W. For Cu—Cu welding, for example, disk lasers may be used, which emit laser light in the green wavelength range in the continuous operating mode and have a maximum laser output of 200 W, and may also have a very high beam quality due to a beam quality factor of constantly less than 1.15. In order to achieve an emission wavelength of, for example, 515 nm, frequency doubling of the disk laser radiation is carried out within a laser resonator. The green laser light thus generated is absorbed by copper materials significantly better than laser radiation in the infrared wavelength range. It has furthermore been observed that in the case of laser welding using green, relatively low-power laser light, essentially no weld spatters occur, thereby considerably simplifying the welding process.

According to one embodiment of the present disclosure, the terminal section of the electrical component and the mating terminal section of the press contact may be arranged parallel to the placement side of the printed circuit board. As a result, it may be achieved that the two sections are easily accessible and may be welded to each other from above by means of a laser.

According to one embodiment of the present disclosure, the weld connection between the terminal section of the electrical component and the mating terminal section of the press contact may be covered with an electrically insulating material. For example, the entire exposed area of the two connection and mating terminal sections may be covered with electrically insulating material and thus be protected from dirt, moisture, or corrosion. The electrically insulating material may, for example, be provided in the form of a coating or a potting compound, for example, globe top or epoxy.

According to one embodiment of the present disclosure, the electronic control module furthermore may include a carrier plate which is arranged on the printed circuit board on a surface opposite to the placement side, wherein the carrier plate is made of plastic. In conventional control modules, a carrier plate made of metal has usually been provided on a printed circuit board. A pure plastic carrier plate would be thermally heavily damaged during conventional soldering, for example, in particular in the pre-heating path; therefore, conventional metal plates are used as carrier plates. In the design provided here, cold-contacting is used; therefore, carrier plates made of plastic may also be used. In addition, a plastic carrier plate may also be closed underneath, thus providing insulation protection with respect to pins which possibly protrude downward. A metal insert is usually required beneath an electronic system in order to be able to dissipate heat losses into the transmission by acting as a cooling surface.

The carrier plate may have a blind hole which is adjacent to an area of a press contact projecting beyond the carrier plate, which accommodates this area. In other words, the carrier plate may be attached to the surface of the printed circuit board opposite to the placement side and may have correspondingly sized recesses, since portions of the press contacts inserted therein may protrude at this surface in the area of the through-holes in the printed circuit board. These recesses may be formed as blind holes, i.e., not continuous but rather closed on one side, so that the protruding areas of the press contacts are able to be accommodated in the recess of the carrier plate and are protected outwardly from dirt and corrosion.

By using a carrier plate made of plastic instead of metal, a considerable weight reduction may be achieved for the control module. In addition, a shaving protection cover on the bottom side of the control module may be omitted. As described above, a shaving protection cover on the top side of the printed circuit board may be replaced by providing an electrically insulating material, for example, in the form of a coating or a potting compound.

By means of the provided production method or with the correspondingly produced electronic control module, a molded housing and a fastening spring for the electronic system may be omitted altogether.

In addition, no pronounced thermal stresses occur in the module, since all components are connected to the printed circuit board, and the carrier plate is only an electrical insulator and a transport protection if no additional demands, for example, functions in the form of an integrated plug, are made on it.

It is to be noted that possible features and advantages of embodiments of the present disclosure are described herein in part with reference to an electronic control module and in part with reference to a method for producing an electronic control module. Those skilled in the art will recognize that the features may be suitably combined, adapted, or exchanged, in order to achieve additional embodiments of the present disclosure.

BRIEF DESCRIPTION OF THE DRAWINGS

Embodiments of the present disclosure will be described with reference to the appended drawings, wherein neither the description nor the drawings are to be interpreted as restricting the present disclosure.

The figures are merely schematic and are not true to scale. In the figures, identical reference numerals refer to identical or identically acting features.

DETAILED DESCRIPTION

Figure 1:
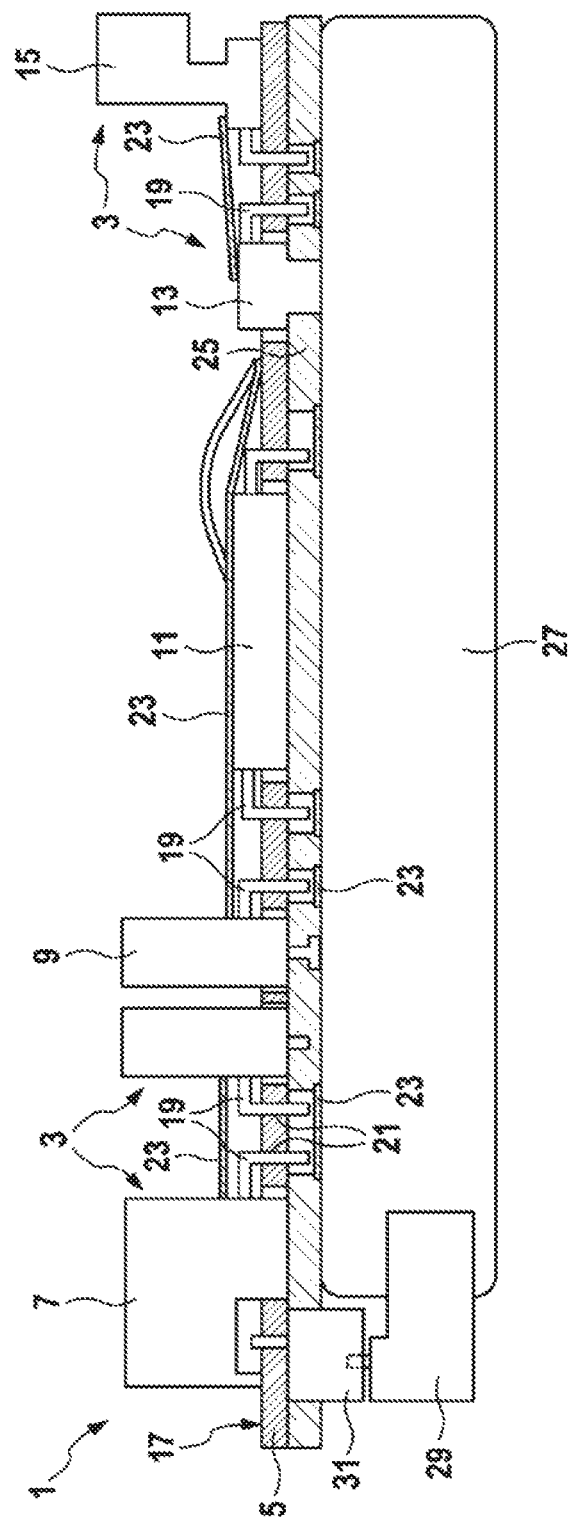
FIG. 1 shows a cross section through a conventional transmission control module.

FIG. 1 shows a conventional transmission control module 1, in which multiple electrical components 3 are soldered to a printed circuit board 5.

The printed circuit board 5 (PCB) has multiple conducting paths on its surface or integrated into its interior (not depicted separately in FIG. 1). The electrical components 3 may, for example, be arranged as a high-current assembly 7, rotational speed, position, or displacement sensors 9, electronic circuits 11, pressure sensors 13, and/or plug's 15, on a placement side 17 of the printed circuit board 5. Each of the components 3 is electrically connected to conducting paths of the printed circuit board 5 via associated electrically conductive terminal sections 19, so that the individual components 3 can be electrically interconnected via the conducting paths. For this purpose, the terminal sections 19 are plugged through through-holes 21 in the printed circuit board 5 and are, for example, soldered to the conducting paths of the printed circuit board 5 from below by dipping in a solder bath.

In order to protect the terminal sections 19, for example, from metal shavings which may be contained in ambient transmission oil, shaving protection covers 23 are provided. A carrier plate 25 made of metal is provided on the printed circuit board 5 opposite the placement side 17. On the one hand, this carrier plate 25 may stabilize the printed circuit board 5, and on the other hand, ensure good heat transfer from the electrical components to a transmission component 27, for example, a hydraulic plate, to which the transmission control module 1 is attached. Furthermore, on the bottom side of the printed circuit board 5, a pressure regulator 29 is provided with a plug which is connected via a contact block or mating plug 31 to the printed circuit board 5.

Figure 2:
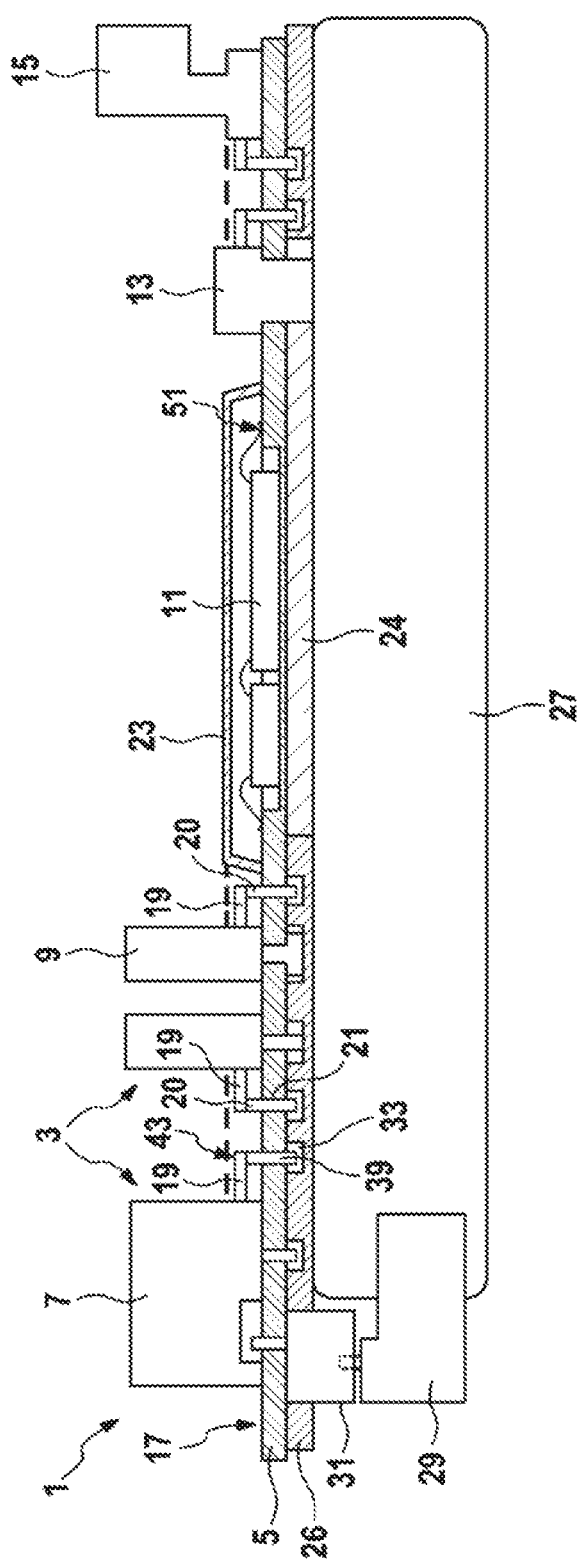
FIG. 2 shows a cross section through a control module for a transmission control according to one embodiment of the present disclosure.

FIG. 2 shows an electronic control module 1 according to one embodiment of the present disclosure.

As in a conventional transmission control module 1, various electrical components 3 are arranged on the placement side 17 of a printed circuit board 5 in the form of various components 7, 9, 11, 13, 15. However, terminal sections 19 of these component parts 3 are not soldered to conducting paths of the printed circuit board 5. Instead, press contacts 39 are pressed into openings 21 of the printed circuit board, so that on the one hand, they are mechanically fixedly anchored, and on the other hand, form an electrical contact with the conducting paths of the printed circuit board 5. The terminal section 19 of the electrical component 3 is locally welded to a mating terminal section 20 of a press contact 39.

Figure 3:
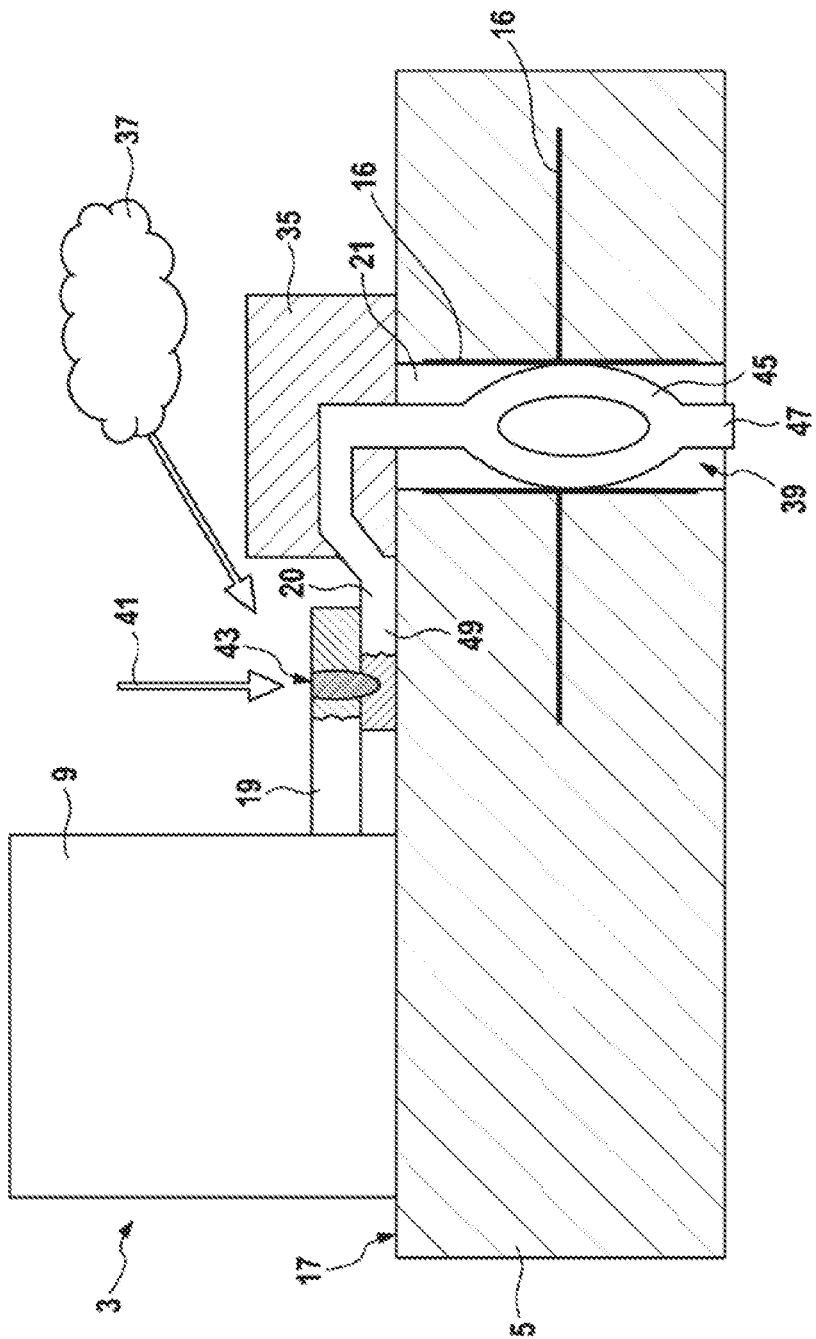
FIG. 3 shows an enlarged cross-sectional view of an electrical connection of an electrical component to a printed circuit board of a control module according to one embodiment of the present disclosure.

The arrangement and electrical connection of the component 3 to the printed circuit board 5 is shown magnified in FIG. 3. The press contact 39 is designed and sized in such a way that it may be pressed into one of the openings 21 in the printed circuit board 5 under pressure. In this case, the press contact 39 may be held in the printed circuit board 5 via a thickened area 45 in such a way that a mechanically stable fixing is provided, and an electrical contact is formed between the mating terminal section 20 of the press contact 39 on the one hand, and conducting paths 16 provided in the printed circuit board 5 on the other hand. In this case, the conducting paths 16 may run in the interior of the printed circuit board 5 and contact a partial area of the mating terminal section 20 in the interior of the opening 20. For example, the interior of the opening may be provided with a metal layer.

The press contact 3 may, for example, be made completely of metal, in particular, for example, completely of copper or a copper alloy. If necessary, it may be provided with a surface coating, for example, made of gold or tin. The press contact may be one piece. Furthermore, the press contact may be essentially rectangular, so that a lower leg 47 may be introduced into the opening 21 of the printed circuit board 5, perpendicular to its plane, and an upper leg 49 is arranged at a right angle to the lower leg 47 and may thus run essentially parallel to the placement side 17 of the printed circuit board 5. In this case, the press contact 39 may be designed in such a way that it rests against the placement side 17 with its upper leg in the state of being pressed into the printed circuit board 5.

A plastic frame 35 which is also provided at the press contact 39 may protect partial areas of the press contact 39 as well as the opening 21 from contamination, in particular due to metal shavings.

The electrical component 3 arranged on the placement side 17, for example, in the form of a sensor 9, has a terminal section 19 which is arranged at least partially overlapping with the mating terminal section 20 of the press contact 39. Both sections 19, 20 thus run parallel to the placement side 17 and may thus be easily connected to each other via a weld 43 by means of a laser irradiated perpendicular to the placement side 17 from above, illustrated by the arrow 41.

In the area of the weld 43 and the adjacent partial areas of the connection and mating terminal sections 19, 20, a subsequently applied layer made of electrically insulating material 37, for example, a globe top, may provide protection from impurities.

As depicted in FIG. 2, the printed circuit board 5 may be connected to the transmission component 27 via a carrier plate 26 made of plastic. A metal plate 24 may be locally integrated into the carrier plate 26, for example, in the area of an electronic circuit 11, which generates a great deal of heat during operation, in order to be better able to dissipate heat to the transmission component 27.

Adjacent to areas of the press contacts 39, which project downward over the printed circuit board 5, a blind hole 33 may be formed in each case in the carrier plate 26, which is sized sufficiently large so that the areas of the press contact 39 projecting beyond the printed circuit board 5 may be accommodated in it on the one hand, and on the other hand, for example, are protected from contamination, since the blind hole 33 is closed downwardly.

Finally, an installation sequence within the scope of producing an electronic control module is to be described.

First, the press contacts 39 are fitted into the openings 21 of the printed circuit board 5. Bonding surfaces 51 are cleaned if necessary. The electronic circuit 11 is glued in and bonded and sealed by an impervious cover 23, for example, by means of a glue or a sealing ring. Subsequently, the printed circuit board is populated with all remaining components 3. Assemblies, for example, sensors 9 and plugs 15, are glued, or are snapped in place or attached by riveting into the printed circuit board 5 via holes. Subsequently, the plastic carrier plate 26 is prepared, if necessary, having an inserted or extrusion-coated metal plate 24 for cooling the electronic circuit 11. The populated printed circuit board 5 may be placed on the carrier plate 26 now or at a later point in time, and attached at a few points, for example, by gluing, riveting, or latching.

The electrical components 3, for example, the sensors 9, 13, etc., have terminal sections 19 which, after the installation, rest against weld surfaces at the mating terminal sections 20 of the press contacts 39, having a slight vertical pre-tensioning. All individual parts are able to balance each other until then with respect to their positions. Stresses and warping during installation do not essentially affect the electrical connection of the components 3 to the printed circuit board 5. The welding of the terminal sections 19 to the mating terminal sections 20 takes place only now, virtually without thermal distortion, due to low melting temperatures of the press contacts 39 which are, for example, made of copper, and minimal heat input on a very small surface (weld point). A green laser light is used as a laser beam 41, which was developed specifically for copper-copper welds. Subsequently, the electrical connection formed in the area of the connection and mating terminal sections 19, 20 may be covered with covers or a coating or potting material made of electrically insulating material, for example, globe top.

Press contacts are more economical and more reliable than, for example, THT solder joints (through-hole technique). Globe top may also protect the press contacting in a printed circuit board opening 21 from a corrosive attack by the surrounding medium, for example, aggressive transmission oil. The overall population of the printed circuit board 5 may take place by means of a fully automated installation on a very compact system. No large selective or continuous furnace soldering systems and no preheating or cooling sections are required. The press contacts 39 may be pressed in and laser-welded in a controlled manner. As a result, testing procedures, for example, the usual x-raying during soldering, may be omitted.

The inserted metal plate 24 included in the embodiments described above, which may act as a heat-conducting plate, may be omitted if cooling oil flows past the printed circuit board 5, for example, in the area of the electronic system, or a plateau-like protuberance of the hydraulic plate acting as a transmission component 27 contacts the printed circuit board 5 directly through the carrier plate 26. The printed circuit board 5 may furthermore have thermal vias below the electronic system, in order to be able to effectuate better cooling.

The invention claimed is:

1. An electronic control module for a transmission control, comprising:
   a printed circuit board having an upper placement side and conducting paths;
   at least one electrical component having an electrically conductive terminal section;
   a press contact that includes a first portion pressed into an opening in the printed circuit board and a mating terminal section, the press contact configured such that the press contact is mechanically fixed to the printed circuit board and forms both a mechanical and an electrical contact with a conducting path of the printed circuit board, wherein the electrically conductive terminal section and a subarea of the mating terminal section are arranged parallel to the placement side of the printed circuit board, the press contact further comprising a central portion located between the first portion and the mating terminal section and having a lowermost surface extending upwardly away from the mating terminal section and downwardly toward the first portion; and
   a weld connection between the electrically conductive terminal section of the electrical component and the subarea of the mating terminal section of the press contact.

2. The electronic control module as claimed in claim 1, wherein the electrically conductive terminal section of the electrical component and the mating terminal section of the press contact are formed with copper.

3. The electronic control module as claimed in claim 1, wherein the weld connection between the electrically conductive terminal section of the electrical component and the mating terminal section of the press contact is covered with electrically insulating material.

4. The electronic control module as claimed in claim 1, further comprising a carrier plate comprised of plastic, the carrier plate arranged on the printed circuit board on a surface opposite to the placement side.

5. The electronic control module as claimed in claim 4, wherein the carrier plate has a blind hole which is adjacent to an area of a press contact projecting beyond the printed circuit board, which accommodates this area.

6. The electronic control module as claimed in claim 1, wherein the conducting path of the printed circuit board is adjacent to the press contact in an interior area of the opening and forms the electrical contact with the mating terminal section of the press contact.

7. A method for producing an electronic control module for a transmission control, comprising:
   pressing a first portion of a press contact into an opening in a printed circuit board such that the press contact is mechanically fixed to the printed circuit board and forms both a mechanical and an electrical contact with a conducting path of the printed circuit board and an electrically conductive terminal section of an electrical component, wherein the electrically conductive terminal section and a subarea of the mating terminal section are arranged parallel to an upper placement side of the printed circuit board, the press contact comprising a central portion located between the first portion and the mating terminal section and having a lowermost surface extending upwardly away from the mating terminal section and downwardly toward the first portion; and
   welding the electrically conductive terminal section to the subarea of the mating terminal section of the press contact.

8. The method as claimed in claim 7, wherein the electrically conductive terminal section of the electrical component is welded to the mating terminal section of the press contact by a laser.

9. The method as claimed in claim 8, wherein the laser emits green laser light configured for welding.

10. The method as claimed in claim 8, wherein the laser has a laser light output in the continuous operating mode of less than 500 W.

11. The method as claimed in claim 10, wherein the laser light output in the continuous operating mode is less than 200 W.

* * * * *